United States Patent
Hong

(10) Patent No.: US 8,427,237 B2
(45) Date of Patent: Apr. 23, 2013

(54) COMMON-MODE FEEDBACK CIRCUIT

(75) Inventor: Merit Hong, Chandler, AZ (US)

(73) Assignee: Fujitsu Semiconductor Limited, Yokohama-shi (JP)

( * ) Notice: Subject to any disclaimer, the term of this patent is extended or adjusted under 35 U.S.C. 154(b) by 48 days.

(21) Appl. No.: 13/078,430

(22) Filed: Apr. 1, 2011

(65) Prior Publication Data

US 2012/0154049 A1   Jun. 21, 2012

Related U.S. Application Data

(60) Provisional application No. 61/423,862, filed on Dec. 16, 2010.

(51) Int. Cl.
  *H03F 3/45* (2006.01)
(52) U.S. Cl.
  USPC ........................................................ 330/258
(58) Field of Classification Search .................. 330/253, 330/255, 258, 260, 263, 264, 267
  See application file for complete search history.

(56) References Cited

U.S. PATENT DOCUMENTS

| | | | |
|---|---|---|---|
| 5,465,073 A * | 11/1995 | Satoh | 330/258 |
| 5,986,502 A | 11/1999 | Nakamura | 330/258 |
| 6,388,522 B1 * | 5/2002 | Fattaruso et al. | 330/258 |
| 7,129,782 B2 * | 10/2006 | Lebedev et al. | 330/258 |
| 7,592,870 B2 * | 9/2009 | Wang et al. | 330/258 |
| 2011/0121902 A1 * | 5/2011 | Wurcer et al. | 330/253 |

* cited by examiner

*Primary Examiner* — Khanh V Nguyen
(74) *Attorney, Agent, or Firm* — Baker Botts L.L.P.

(57) ABSTRACT

A differential amplifier circuit with common-mode feedback is disclosed. The amplifier may include a first stage comprising a first differential input configured to drive a first differential pair transistor in a first differential current path, a second differential input configured to drive a second differential pair transistor in a second differential current path, a first differential output, and a second differential output, a second stage comprising a first differential input, a second differential input, a first differential output, and a second differential output, a common-mode feedback circuit, a first conducting element in a first common-mode current path parallel to the first differential current path and comprising a first conducting terminal coupled to the first differential output of the first stage, and a second conducting element in a second common-mode current path parallel to the second differential current path and comprising a first conducting terminal coupled to the second differential output of the first stage.

12 Claims, 3 Drawing Sheets

COMMON-MODE FEEDBACK CIRCUIT

RELATED APPLICATIONS

This application claims the benefit under 35 U.S.C. §119 (e) of U.S. Provisional Application Ser. No. 61/423,862 filed Dec. 16, 2010.

TECHNICAL FIELD

The present invention relates generally to electrical circuits, and more particularly, to common-mode feedback in operational amplifiers.

BACKGROUND

Electrical circuits experience various types of noise, including but not limited to thermal noise, shot noise, and 1/f noise. Many circuits, such as operational amplifiers (amplifiers) are designed with a goal of optimizing the signal-to-noise ratio. One method to reduce noise in an amplifier may be to increase the gate size of field-effect transistors (FETs) used in the signal path. Commonly used FETs include NMOS and PMOS transistors. Increasing the gate size of a FET creates more gate area over which the thermal noise associated with any one location in the gate may be averaged. Increasing the gate size of a FET may also reduce 1/f noise. Examples of this technique may include using large FET sizes for the differential pair or the matching current sources in the first stage of a multi-stage differential amplifier.

Amplifiers may also employ a common-mode feedback loop in order to keep the common mode of a differential voltage signal at a proper operating level. It may be desirable for this common-mode feedback loop to operate at high frequencies in a stable manner. However, increasing gate sizes of FETs in an amplifier to reduce noise will result in increased gate-to-source capacitances for those FETs. Large capacitances in the common-mode feedback loop will limit the frequency at which the loop will operate in a stable manner. Thus, when a traditional differential amplifier employs a common-mode feedback loop, there may be a trade-off between reducing noise in the differential signal by using large FETs, and the frequency at which the common-mode feedback loop can operate in a stable manner.

Another problem for amplifiers employing an even number of inverting stages may be the potential for lock-up when feedback is utilized to close the amplifier's signal loop. For example, an input signal with an overly high or low common-mode may cause certain node voltages to swing high or low approaching the power supply or ground rails outside of their intended operating range. Certain transistors may be locked outside of their normal operating range, causing the amplifier as a whole to lock up in a stable but undesired state. The lock-up problem may occur in multi-stage amplifiers where an even number of stages are inverting, including but not limited to FET-based topologies, bipolar junction transistor (BJT)-based topologies, and combinations thereof.

SUMMARY

In accordance with some embodiments of the present disclosure, a differential amplifier with common-mode feedback may include a first stage comprising a first differential input configured to drive a first differential pair transistor in a first differential current path, a second differential input configured to drive a second differential pair transistor in a second differential current path, a first differential output, and a second differential output, a second stage comprising a first differential input, a second differential input, a first differential output, and a second differential output, a common-mode feedback circuit, a first conducting element in a first common-mode current path parallel to the first differential current path and comprising a first conducting terminal coupled to the first differential output of the first stage, and a second conducting element in a second common-mode current path parallel to the second differential current path and comprising a first conducting terminal coupled to the second differential output of the first stage.

In accordance with some embodiments of the present disclosure, a differential amplifier with common-mode feedback may include a first stage comprising a first differential input configured to drive a first differential pair transistor in a first differential current path, a second differential input configured to drive a second differential pair transistor in a second differential current path, a first differential output, and a second differential output, a second stage comprising a first differential input, a second differential input, a first differential output, and a second differential output, and a common-mode feedback circuit configured to drive a first conducting element and a second conducting element, the first conducting element in a first common-mode current path parallel to the first differential current path and comprising a first conducting terminal coupled to the first differential output of the first stage, the second conducting element in a second common-mode current path parallel to the second differential current path and comprising a first conducting terminal coupled to the second differential output of the first stage.

Technical advantages of one or more embodiments of the present disclosure may include reducing noise in an operational amplifier while maintaining sufficient common-mode feedback performance and preventing lock-up when the amplifier experiences an overly high or overly low common-mode input signal.

It will be understood that the various embodiments of the present disclosure may include some, all, or none of the enumerated technical advantages. In addition, other technical advantages of the present disclosure may be readily apparent to one skilled in the art from the figures, description and claims included herein.

BRIEF DESCRIPTION OF THE DRAWINGS

For a more complete understanding of the present disclosure and its features and advantages, reference is now made to the following description, taken in conjunction with the accompanying drawings, in which.

DETAILED DESCRIPTION

Some embodiments of the present disclosure provide a multi-stage fully differential amplifier with a common-mode feedback loop that may not be limited by large gate capacitances of FETs in the differential signal path of the first stage.

Some embodiments provide a multi-stage fully differential amplifier with a common mode current path that prevents lock-up.

Figure 1:
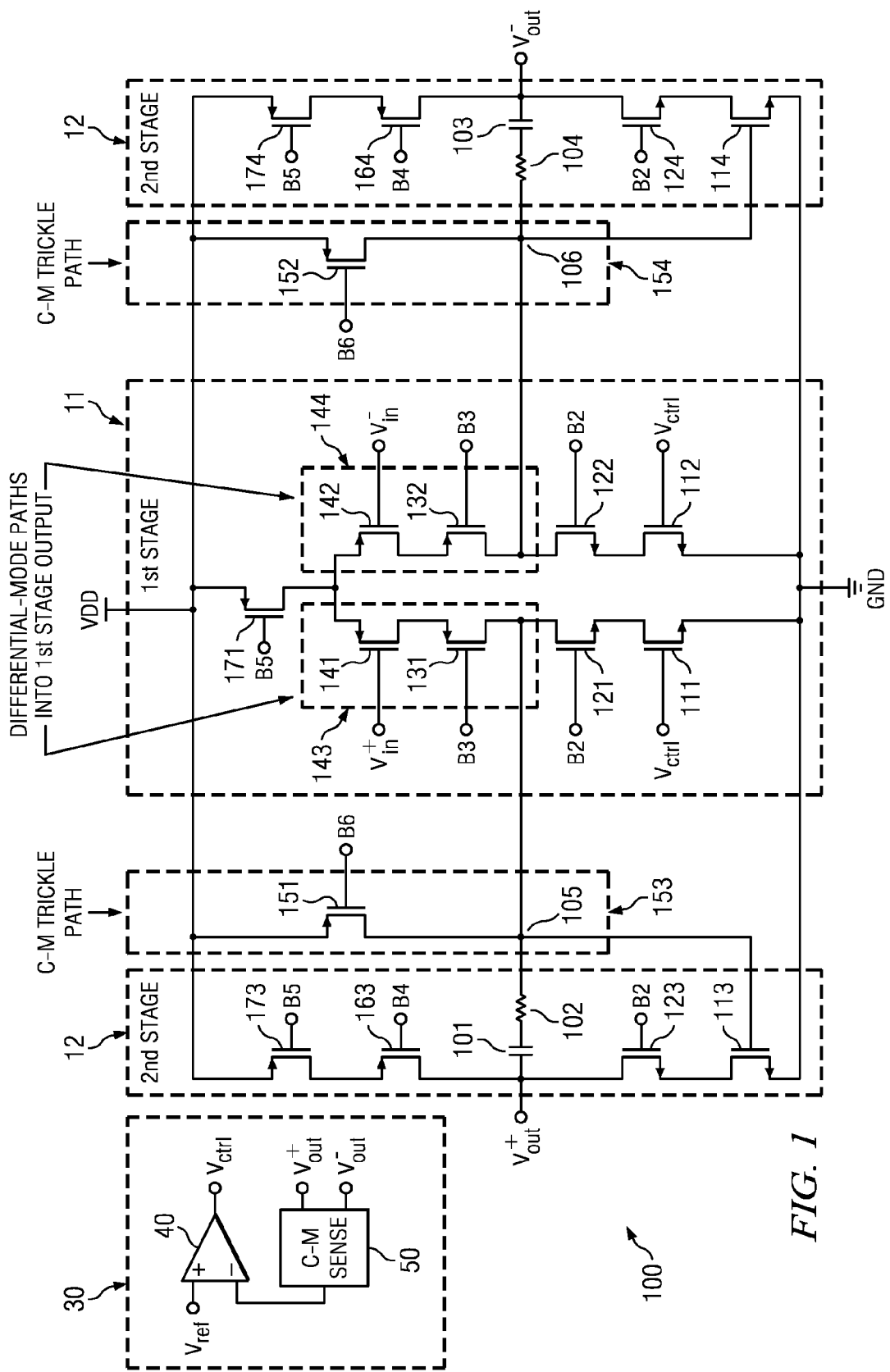
FIG. 1 illustrates a schematic diagram of an example fully differential amplifier with common-mode feedback, in accordance with certain embodiments of the present disclosure.

FIG. 1 illustrates a schematic diagram of a multi-stage fully differential amplifier 100, in accordance with certain embodiments of the present disclosure. The amplifier 100 may include a first stage 11, a second stage 12, a common-mode feedback circuit 30, a first conducting element 151, and a second conducting element 152. Power may be supplied to amplifier 100 through a high potential power supply and a low potential power supply. For the purposes of this disclosure, a high potential power supply may be referred to as VDD, and a low potential power supply may be referred to as GND.

As shown in FIG. 1, the first stage 11 may have a first differential input, a second differential input, a first differential output, and a second differential output. The first differential input of the first stage 11 may be coupled to the first differential input $V^+_{in}$ of the amplifier 100, and the second differential input of the first stage 11 may be coupled to the second differential input $V^-_{in}$ of the amplifier 100. The first differential output of the first stage 11 may be coupled to node 105, and the second differential output of the first stage 11 may be coupled to node 106.

The first stage 11 of the amplifier 100 may include a PMOS current source 171, PMOS differential pair transistors 141, 142, PMOS cascode transistors 131, 132, NMOS cascode transistors 121, 122, and NMOS current sources 111, 112. The source of PMOS current source 171 may be coupled to VDD, and PMOS current source 171 may be driven at its gate by a bias voltage B5. The sources of the PMOS differential pair transistors 141, 142 may be coupled together in a common source configuration and may be further coupled to the drain of the PMOS current source 171. The first PMOS differential pair transistor 141 may receive the first differential input $V^+_{in}$, and the second PMOS differential pair transistor 142 may receive the second differential input $V^-_{in}$. The respective drains of the first and second differential pair transistors 141, 142 may be coupled to the sources of PMOS cascode transistors 131, 132. The PMOS cascode transistors 131, 132 may be driven at their gates by a bias voltage B3. The respective drains of the PMOS cascode transistors 131, 132 may be coupled to the drains of the NMOS cascode transistors 121, 122, which may be driven at their gates by a bias voltage B2. The respective sources of NMOS cascode transistors 121, 122 may be coupled to the drains of NMOS current sources 111, 112. The sources of NMOS current sources 111, 112 may be coupled to GND, and the NMOS current sources 111, 112 may be driven at their gates by the $V_{ctrl}$ signal from the common-mode feedback circuit 30.

As shown in FIG. 1, the second stage 12 of the amplifier 100 may have a first differential input, a second differential input, a first differential output, and a second differential output. The first differential input of the second stage 12 may be coupled to node 105, and the second differential input of the second stage 12 may be coupled to node 106. The first differential output of the second stage 12 may be coupled to the first differential output $V^+_{out}$ of the amplifier 100, and the second differential output of the second stage 12 may be coupled to the second differential output $V^-_{out}$ of the amplifier 100.

The first differential output of the first stage 11 may be coupled to the first differential input of the second stage 12 at node 105, and the second differential output of the first stage 11 may be coupled to the second differential input of the second stage 12 at node 106. In some alternative embodiments, the signal paths between the respective outputs of the first stage and the inputs of the second stage may include one or more other stages, one or more other conducting devices, or combinations thereof. In such alternative embodiments the outputs of the first stage and the inputs of the second stage are still to be considered coupled together.

The second stage 12 in amplifier 100 may include PMOS current sources 173, 174, PMOS cascode transistors 163, 164, compensation resistors 102, 104, compensation capacitors 101, 103, NMOS cascode transistors 123, 124, and NMOS transistors 113, 114. The sources of PMOS current sources 173, 174 may be coupled to VDD, and the PMOS current sources 173, 174 may be driven at their respective gates by a bias voltage B5. The respective drains of PMOS current sources 173, 174 may be coupled to the sources of PMOS cascode transistors 163, 164, which may be driven at their gates by a bias voltage B4. The drain of PMOS cascode transistor 163 may be coupled to the first differential output $V^+_{out}$, and the drain of PMOS cascode transistor 164 may be coupled to the second differential output $V^-_{out}$. The respective drains of PMOS cascode transistors 163, 164 may be further coupled to the drains of NMOS cascode transistors 123, 124, which may be driven at their gates by a bias voltage B2. The respective sources of NMOS cascode transistors 123, 124 may be coupled to the drains of NMOS transistors 113, 114. The sources of NMOS transistors 113, 114 may be coupled to GND. First NMOS transistor 113 may have a gate coupled to node 105 and may be driven by the first differential input of the second stage 12. Second NMOS transistor 114 may have a gate coupled to node 106 and may be driven by the second differential input of the second stage 12. For frequency compensation, a resistor 102 and a capacitor 101 may be coupled in series between the first differential input and the first differential output of the second stage 12, and a resistor 104 and a capacitor 103 may be coupled in series between the second differential input and the second differential output of the second stage 12.

As shown in FIG. 1, the common-mode feedback circuit 30 may monitor the common-mode voltage of $V^+_{out}$ and $V^-_{out}$. The common-mode sense circuit 50 may sense the common-mode voltage of $V^+_{out}$ and $V^-_{out}$. The positive input to amplifier 40 may be coupled to a voltage reference $V_{ref}$, and the negative input to amplifier 40 may be coupled to the output of the common-mode sense circuit 50. Accordingly, the common-mode voltage of $V^+_{out}$ and $V^-_{out}$ may be measured by amplifier 40 against the reference voltage $V_{ref}$. The amplifier 40 may generate the common-mode feedback signal, $V_{ctrl}$.

As shown in FIG. 1, the common-mode feedback loop may be formed by driving the gates of the first and second NMOS current sources 111, 112 with the common-mode feedback signal $V_{ctrl}$. The $V_{ctrl}$ signal may drive the first and second NMOS current sources 111, 112 in a manner which may keep the common-mode of the differential outputs of the first stage 11 within a desired range regardless of the common mode of the $V^+_{in}$ and $V^-_{in}$ inputs. Accordingly, the differential inputs of the second stage 12 will be driven at a voltage within a desired operating range, and the second stage 12 may drive the differential output, $V^+_{out}$ and $V^-_{out}$, within a desired output range.

In some alternative embodiments, the common-mode feedback loop may be formed by driving other devices in the first stage 11 or by injecting current into or sinking current from other nodes within the first stage 11. For example, in some alternative embodiments, the gates of NMOS current sources 111, 112 may be driven by a bias voltage while the gate of PMOS current source 171 may be driven by the common-mode feedback signal $V_{ctrl}$.

As shown in FIG. 1, the first conducting element 151 may have a first conducting terminal coupled to the first differential output of the first stage 11 at node 105. The second conducting element 152 may have a first conducting terminal coupled to the second differential output of the first stage 11 at node 106. The first conducting element 151 and the second conducting element 152 may be comprised of instantiations of components independent from the instantiations of components forming the first stage 11 and the second stage 12.

The first conducting element 151 may have a second conducting terminal coupled to a high potential power supply VDD. The first conducting element 151 may comprise a PMOS transistor driven at its gate by a bias voltage B6. The drain of the PMOS transistor may form the first conducting terminal of the first conducting element 151, and the source of the PMOS transistor may form the second conducting terminal of the first conducting element 151. The second conducting element 152 may comprise a PMOS transistor driven at its gate by a bias voltage B6. The drain of the PMOS transistor may form the first conducting terminal of the second conducting element 152, and the source of the PMOS transistor may form the second conducting terminal of the second conducting element 152. In some alternative embodiments, the first and second conducting elements 151, 152 may comprise one or more devices including but not limited to PMOS transistors, NMOS transistors, bipolar-junction transistors, JFETs, diodes, resistors, and combinations thereof. Some embodiments of the first and second conducting elements 151, 152 may comprise self-biased devices, including but not limited to PMOS transistors, NMOS transistors, bipolar-junction transistors, JFETs. Some embodiments the first and second conducting elements 151, 152 may comprise devices that require no biasing including but not limited to resistors and diodes.

The common-mode paths 153, 154 into the first-stage differential outputs may prevent lock-up. When an overly high or overly low common-mode input at $V^+_{in}$ and $V^-_{in}$ causes certain node voltages in the first stage 11 to swing high or low outside of their intended operating range, certain transistors in the first stage 11 may be locked outside of their normal operating range. For example, in the embodiment illustrated in FIG. 1, when an overly high common-mode input at $V^+_{in}$ and $V^-_{in}$ is experienced, the differential pair transistors 141, 142 may not have the necessary gate-to-source threshold voltage to operate. With the differential pair transistors 141, 142 turned off, the voltage potential of the first and second differential outputs of the first stage 11 may drop. If the outputs of the first stage were allowed to drop to a voltage insufficient to drive the second stage, the $V^+_{out}$ and $V^-_{out}$ outputs of the amplifier 100 could rise and approach the voltage of the high potential power supply VDD, and in a configuration where $V^+_{out}$ and $V^-_{out}$ are coupled through a feedback network to $V^+_{in}$ and $V^-_{in}$, the amplifier 100 could lock-up in a stable but undesired state. However, as shown in FIG. 1, the first conducting element 151 and the second conducting element 152 may provide trickle currents to the first and second outputs of the first stage 11 outputs coupled to nodes 105 and 106. The first conducting element 151 and the second conducting element 152 may comprise instantiations of devices independent from the instantiations of devices that form the first stage 11 and the second stage 12. Accordingly, the common-mode current paths 153, 154 will not be affected by transistors in the first stage that have turned off in response to an overly high or overly low common-mode input. The common-mode current paths 153, 154 may keep the differential outputs of the first stage 11 at a sufficient voltage potential to drive the second stage 12, preventing the possibility of lock-up.

In order to reduce current consumption, the trickle currents provided by the common-mode current paths 153, 154 may be designed to be substantially less than the bias currents of the first stage 11 and second stage 12. In some example embodiments, the ratio of the current provided by the PMOS current source to the trickle current may be as high as 100:1 or greater, while in some other example embodiments, the ratio may be as low as 10:1 or less.

Some alternative embodiments of the differential amplifier 100 with common-mode feedback may include other multi-stage differential amplifier topologies. Some alternative embodiments may include an alternative first-stage topology, an alternative second-stage topology, an alternative common-mode feedback circuit topology, or combinations thereof. Some alternative topologies may include the use other types of transistors, including but not limited to bipolar-junction transistors, JFETs, and combinations thereof with NMOS and PMOS transistors.

The coupling of the second conducting terminals of the first and second conducting elements 151, 152 may depend on the topology chosen for the first stage 11 of the amplifier 100. To ensure that the outputs of the first stage 11 are driven at a voltage potential sufficient to drive second stage 12, the common-mode current paths 153, 154 may operate in parallel to the differential current paths 143, 144 inside of the first stage 11. Accordingly, common-mode current paths 153, 154 may provide current to the differential outputs of the first stage 11 from VDD in parallel to the differential current paths 143, 144, which steer current to the differential outputs of the first stage from the PMOS current source 171 coupled to VDD.

But, in some alternative embodiments, the common-mode current paths may sink current from the differential outputs in the first stage. For example, in some alternative embodiments, the first stage may include an NMOS differential pair steering differential current paths that sink current from the differential outputs of the first stage to a current source coupled to GND. Accordingly, in some alternative embodiments, to ensure that the outputs of the first stage are driven at a voltage potential capable to drive the second stage, the common-mode current paths may sink current from the differential outputs of the first stage to the low potential power supply GND.

Figure 2:
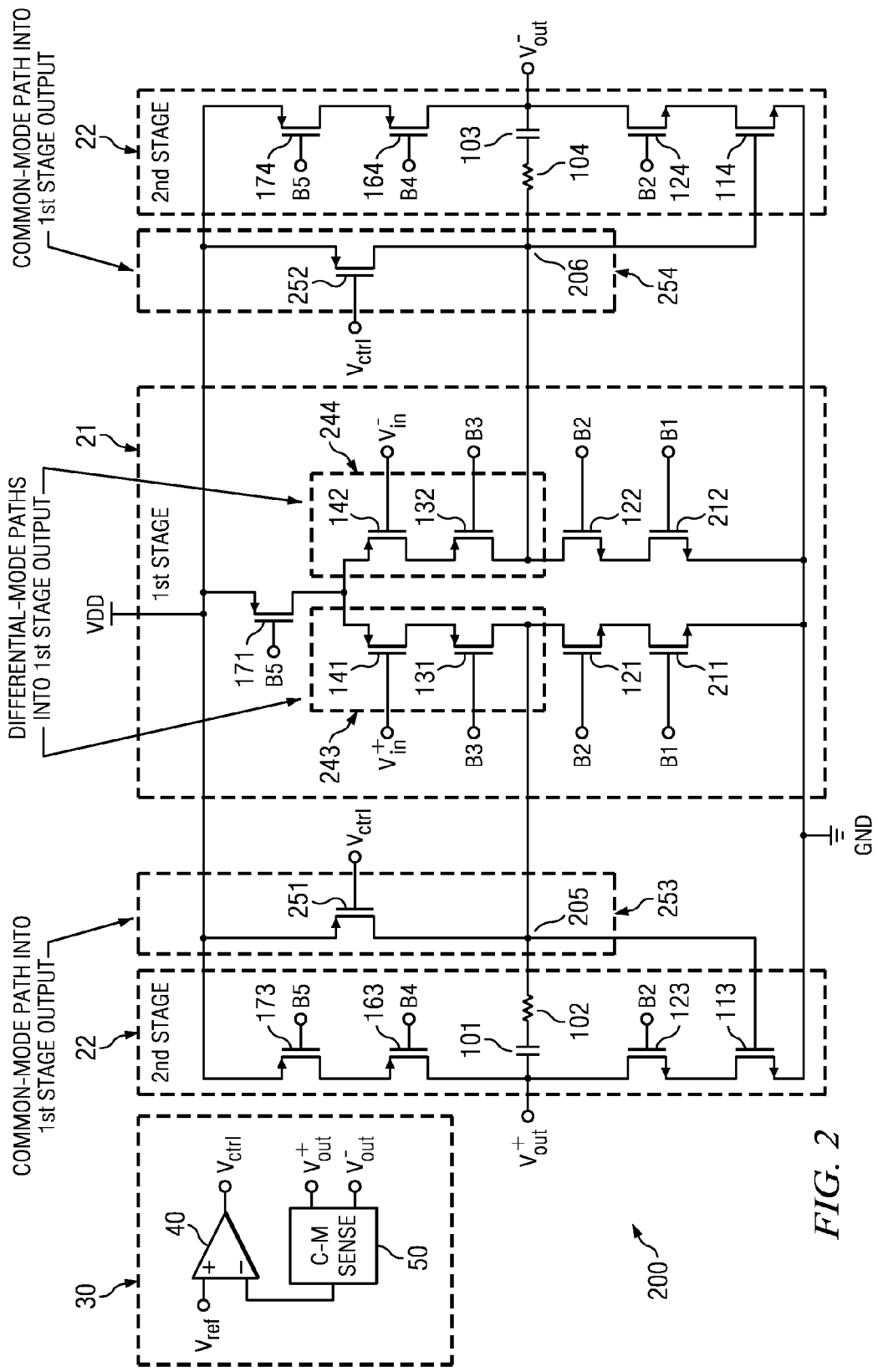
FIG. 2 illustrates a schematic diagram of another example fully differential amplifier with common-mode feedback, in accordance with certain embodiments of the present disclosure.

FIG. 2 illustrates a schematic diagram of a multi-stage fully differential amplifier 200, in accordance with certain embodiments of the present disclosure. The amplifier 200 may include a first stage 21, a second stage 22, a common-mode feedback circuit 30, a first conducting element 251, and a second conducting element 252. The first conducting element 251 and the second conducting element 252 may be driven by the common-mode feedback circuit 30.

As shown in FIG. 2, the first stage 21 may have a first differential input, a second differential input, a first differential output, and a second differential output. The first differential input of the first stage 21 may be coupled to the first differential input $V^+_{in}$ of the amplifier 200, and the second differential input of the first stage 21 may be coupled to the second differential input $V^-_{in}$ of the amplifier 200. The first differential output of the first stage 21 may be coupled to node 205, and the second differential output of the first stage 21 may be coupled to node 206.

The first stage 21 of the amplifier 200 may include a PMOS current source 171, PMOS differential pair transistors 141, 142, PMOS cascode transistors 131, 132, NMOS cascode transistors 121, 122, and NMOS current sources 211, 212. The source of PMOS current source 171 may be coupled to VDD, and the PMOS current source 171 may be driven at its gate by a bias voltage B5. The sources of the PMOS differential pair transistors 141, 142 may be coupled together in a common source configuration and may be further coupled to the drain of the PMOS current source 171. The first PMOS differential pair transistor 141 may receive the first differential input $V^+_{in}$, and the second PMOS differential pair transistor 142 may receive the second differential input $V^-_{in}$. The respective drains of the first and second differential pair transistors 141, 142 may be coupled to the sources of PMOS cascode transistors 131, 132. The PMOS cascode transistors 131, 132 may be driven at their gates by a bias voltage B3. The respective drains of the PMOS cascode transistors 131, 132 may be coupled to the drains of the NMOS cascode transistors 121, 122, which may be driven at their gates by a bias voltage B2. The respective sources of NMOS cascode transistors 121, 122 may be coupled to the drains of NMOS current sources 211, 212. The sources of NMOS current sources 211, 212 may be coupled to GND, and NMOS current sources 211, 212 may be driven at their gates by a bias voltage B1.

As shown in FIG. 2, the second stage 22 of the amplifier 200 may have a first differential input, a second differential input, a first differential output, and a second differential output. The first differential input of the second stage 22 may be coupled to node 205, and the second differential input of the second stage 22 may be coupled to node 206. The first differential output of the second stage 22 may be coupled to the first differential output $V^+_{out}$ of the amplifier 200, and the second differential output of the second stage 22 may be coupled to the second differential output $V^-_{out}$ of the amplifier 200.

The first differential output of the first stage 21 may be coupled to the first differential input of the second stage 22 at node 205, and the second differential output of the first stage 21 may be coupled to the second differential input of the second stage 22 at node 206. In some alternative embodiments, the signal paths between the respective outputs of the first stage and the inputs of the second stage may include one or more other stages, one or more other conducting devices, or combinations thereof. In such alternative embodiments the outputs of the first stage and the inputs of the second stage are still to be considered coupled together.

The second stage 22 in amplifier 200 may include PMOS current sources 173, 174, PMOS cascode transistors 163, 164, compensation resistors 102, 104, compensation capacitors 101, 103, NMOS cascode transistors 123, 124, and NMOS transistors 113, 114. The sources of PMOS current sources 173, 174 may be coupled to VDD, and the PMOS current sources 173, 174 may be driven at their respective gates by a bias voltage B5. The respective drains of PMOS current sources 173, 174 may be coupled to the sources of PMOS cascode transistors 163, 164, which may be driven at their gates by a bias voltage B4. The drain of PMOS cascode transistor 163 may be coupled to the first differential output $V^+_{out}$, and the drain of PMOS cascode transistor 164 may be coupled to the second differential output $V^-_{out}$. The respective drains of PMOS cascode transistors 163, 164 may be further coupled to the drains of NMOS cascode transistors 123, 124, which may be driven at their gates by a bias voltage B2. The respective sources of NMOS cascode transistors 123, 124 may be coupled to the drains of NMOS transistors 113, 114, and the sources of NMOS transistors 113, 114 may be coupled to GND. First NMOS transistor 113 may have a gate coupled to node 205 and may be driven by the first differential input of the second stage 22. Second NMOS transistor 114 may have a gate coupled to node 206 and may be driven by the second differential input of the second stage 22. For compensation, a resistor 102 and a capacitor 101 may be coupled in series between the first differential input and the first differential output of the second stage 22, and a resistor 104 and a capacitor 103 may be coupled in series between the second differential input and the second differential output of the second stage 22.

As shown in FIG. 2, the common-mode feedback circuit 30 may monitor the common-mode voltage of $V^+_{out}$ and $V^-_{out}$. The common-mode sense circuit 50 may sense the common-mode voltage of $V^+_{out}$ and $V^-_{out}$. The positive input to amplifier 40 may be coupled to a voltage reference $V_{ref}$, and the negative input to amplifier 40 may be coupled to the output of the common-mode sense circuit 50. Accordingly, the common-mode voltage of $V^+_{out}$ and $V^-_{out}$ may be measured by amplifier 40 against the reference voltage $V_{ref}$. The amplifier 40 may generate the common-mode feedback signal, $V_{ctrl}$.

As shown in FIG. 2, the common-mode feedback loop may be formed by driving the first conducting element 251 and the second conducting element 252 with the common-mode feedback signal $V_{ctrl}$. The $V_{ctrl}$ signal may drive the first and second conducting elements 251, 252 in a manner which may keep the common-mode of the differential outputs of the first stage 21 within a desired range regardless of the common mode of the $V^+_{in}$ and $V^-_{in}$ inputs. Accordingly, the differential inputs of the second stage 22 will be driven at a voltage within a desired operating range, and the second stage 22 may drive the differential output, $V^+_{out}$ and $V^-_{out}$, within a desired output range.

The first conducting element 251 may have a first conducting terminal coupled to the first differential output of the first stage 21 at node 205. The second conducting element 252 may have a first conducting terminal coupled to the second differential output of the first stage 21 at node 206. The first conducting element 251 and the second conducting element 252 may be comprised of instantiations of components independent from the instantiations of components forming the first stage 21 and the second stage 22.

The first conducting element 251 may have a second conducting terminal coupled to a high potential power supply VDD. The first conducting element 251 may comprise a PMOS transistor. The drain of the PMOS transistor may form the first conducting terminal of the first conducting element 251, and the source of the PMOS transistor may form the second conducting terminal of the first conducting element 251. The second conducting element 252 may have a second conducting terminal coupled to a high potential power supply VDD. The second conducting element 252 may comprise a PMOS transistor. The drain of the PMOS transistor may form the first conducting terminal of the second conducting element 252, and the source of the PMOS transistor may form the second conducting terminal of the second conducting element 252. In some alternative embodiments, the first and second conducting elements 251, 252 may comprise one or more devices, including but not limited to PMOS transistors, NMOS transistors, bipolar-junction transistors, JFETs, diodes, resistors, and combinations thereof.

As shown in FIG. 2, the first conducting element 251 may provide a common-mode path 253 into the first differential output of the first stage 21, and the second conducting element 252 may provide a common-mode path 254 into the second differential output of the first stage 21. Common-mode paths 253, 254 may be separate from the differential mode paths 243, 244 in the first stage 21. Accordingly, the common-mode feedback loop does not overlap with the differential mode paths 243, 244 in the first stage 21. Thus, the common-mode feedback loop may operate in a manner that may be not substantially limited by the characteristics of the first stage 21. In particular, the frequency at which the common-mode feedback loop may operate in a stable manner may be unaffected by the sizes of the gate-to-source capacitances of certain transistors in the first stage 21. The PMOS differential pair transistors 141, 142 and the NMOS current sources 211, 212 may have large gate sizes to minimize thermal noise and 1/f noise without impacting the frequency at which the common-mode feedback loop can operate in a stable manner.

Furthermore, the common-mode paths 253, 254 into the first-stage differential outputs may prevent lock-up. When an overly high or overly low common-mode input at $V^+_{in}$ and $V^-_{in}$ causes certain node voltages in the first stage 21 to swing high or low outside of their intended operating range, certain transistors in the first stage 21 may be locked outside of their normal operating range. For example, when an overly high common-mode input at $V^+_{in}$ and $V^-_{in}$ is experienced, the PMOS differential pair transistors 141, 142 may not have the necessary gate-to-source threshold voltage to operate. With the differential pair transistors 141, 142 turned off, the voltage potential of the first and second differential outputs of the first stage 21 may drop. If the outputs of the first stage were allowed to drop to a voltage insufficient to drive the second stage, the $V^+_{out}$ and $V^-_{out}$ outputs of the amplifier 200 could rise and approach the voltage of the high potential power supply VDD, and in a configuration where $V^+_{out}$ and $V^-_{out}$ are coupled through a feedback network to $V^+_{in}$ and $V^-_{in}$, the amplifier 200 could lock-up in a stable but undesired state. However, the first conducting element 251 and the second conducting element 252 may provide common-mode current paths 253, 254 into the first-stage outputs that may be independent from transistors in the first stage 21 that may be locked out of their normal operating range. Accordingly, the common-mode feedback loop will not be broken by transistors in the first stage that have turned off in response to an overly high or overly low common-mode input. Thus lock-up due to an overly high or overly low common-mode input into $V^+_{in}$ and $V^-_{in}$ may be prevented.

Some alternative embodiments of the differential amplifier 200 with common-mode feedback may include other multi-stage differential amplifier topologies. Some alternative embodiments may include an alternative first-stage topology, an alternative second-stage topology, an alternative common-mode feedback circuit topology, or combinations thereof. Some alternative topologies may include the use other types of transistors, including but not limited to bipolar-junction transistors, JFETs, and combinations thereof with NMOS and PMOS transistors.

Figure 3:
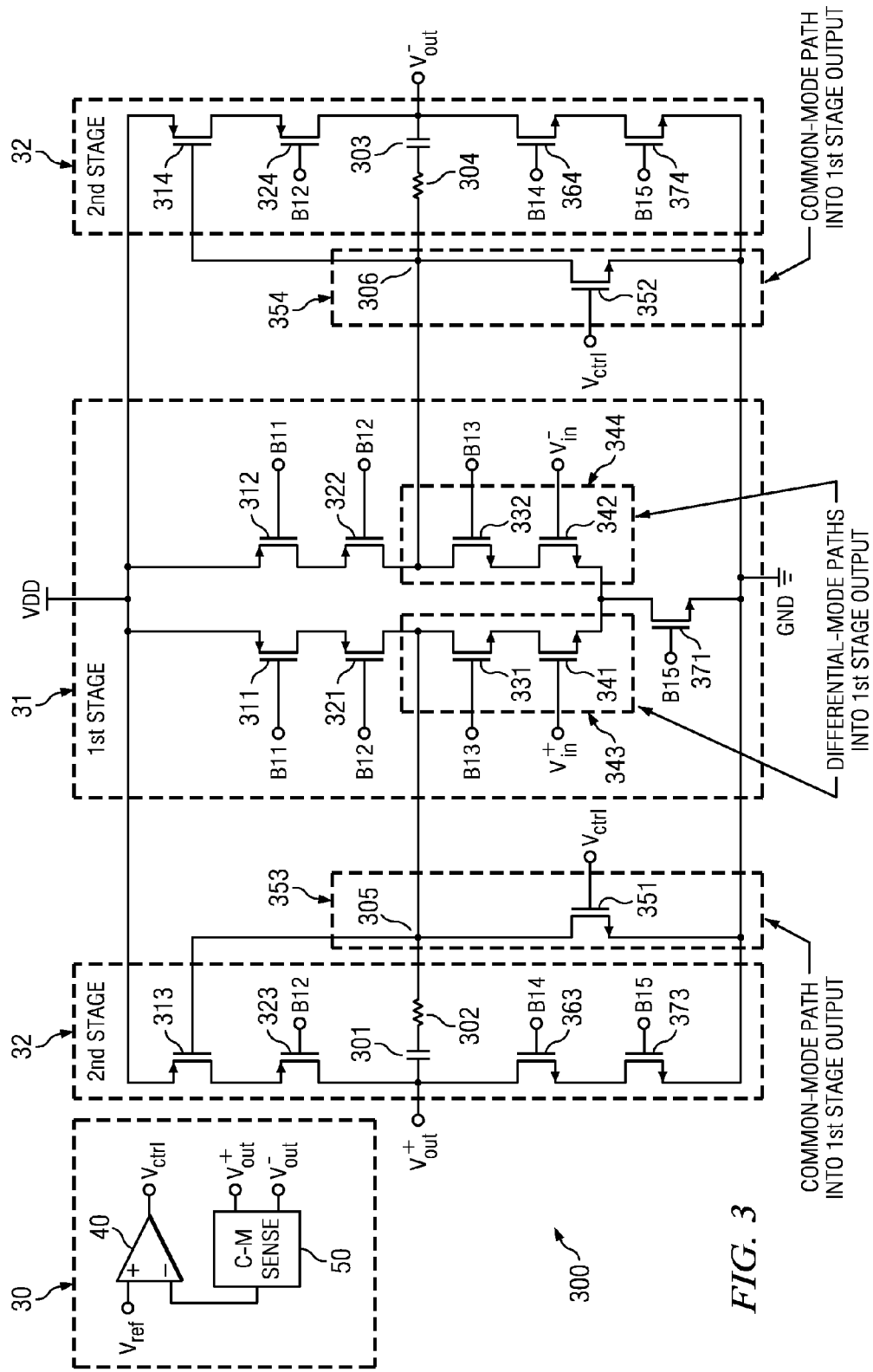
FIG. 3 illustrates a schematic diagram of another example fully differential amplifier with common-mode feedback, in accordance with certain embodiments of the present disclosure.

FIG. 3 illustrates a schematic diagram of a multi-stage fully differential amplifier 300, in accordance with certain embodiments of the present disclosure. The amplifier 300 may include a first stage 31, a second stage 32, a common-mode feedback circuit 30, a first conducting element 351, and a second conducting element 352. The first conducting element 351 and the second conducting element 352 may be driven by the common-mode feedback circuit 30.

As shown in FIG. 3, the first stage 31 may have a first differential input, a second differential input, a first differential output, and a second differential output. The first differential input of the first stage 31 may be coupled to the first differential input $V^+_{in}$ of the amplifier 300, and the second differential input of the first stage 31 may be coupled to the second differential input $V^-_{in}$ of the amplifier 300. The first differential output of the first stage 31 may be coupled to node 305, and the second differential output of the first stage 31 may be coupled to node 306.

The first stage 31 of the amplifier 300 may include an NMOS current source 371, NMOS differential pair transistors 341, 342, NMOS cascode transistors 331, 332, PMOS cascode transistors 321, 322, and PMOS current sources 311, 312. The source of NMOS current source 371 may be coupled to GND, and the NMOS current source 371 may be driven at its gate by a bias voltage B15. The sources of the NMOS differential pair transistors 341, 342 may be coupled together in a common-source configuration and may be further coupled to the drain of the NMOS current source 371. The first NMOS differential pair transistor 341 may receive the first differential input $V^+_{in}$ and the second NMOS differential pair transistor 342 may receive the second differential input $V^-_{in}$. The respective drains of the first and second differential pair transistors 341, 342 may be coupled to the sources of NMOS cascode transistors 331, 332. The NMOS cascode transistors 331, 332 may be driven at their gates by a bias voltage B13. The respective drains of NMOS cascode transistors 331, 332, may be coupled to the drains of PMOS cascode transistors 321, 322, which may be driven at their gates by a bias voltage B12. The respective sources of PMOS cascode transistors 321, 322 may be coupled to the drains of PMOS current sources 311, 312. The sources of PMOS current sources 311, 312 may be coupled to VDD, and PMOS current sources 311, 312 may be driven at their gates by a bias voltage B11.

As shown in FIG. 3, the second stage 32 of the amplifier 300 may have a first differential input, a second differential input, a first differential output, and a second differential output. The first differential input of the second stage 32 may be coupled to node 305, and the second differential input of the second stage 32 may be coupled to node 306. The first differential output of the second stage 32 may be coupled to the first differential output $V^+_{out}$ of the amplifier 300, and the second differential output of the second stage 32 may be coupled to the second differential output $V^-_{out}$ of the amplifier 300.

The first differential output of the first stage 31 may be coupled to the first differential input of the second stage 32 at node 305, and the second differential output of the first stage 31 may be coupled to the second differential input of the second stage 32 at node 306. In some alternative embodiments, the signal paths between the respective outputs of the first stage and the inputs of the second stage may include one or more other stages, one or more other conducting devices, or combinations thereof. In such alternative embodiments the outputs of the first stage and the inputs of the second stage are still to be considered coupled together.

The second stage 32 in amplifier 300 may include NMOS current sources 373, 374, NMOS cascode transistors 363, 364, compensation resistors 302, 304, compensation capacitors 301, 303, PMOS cascode transistors 323, 324, and PMOS transistors 313, 314. The sources of NMOS current sources 373, 374 may be coupled to GND, and the NMOS current sources 373, 374 may be driven at their respective gates by a bias voltage B15. The respective drains of NMOS current sources 373, 374 may be coupled to the sources of NMOS cascode transistors 363, 364, which may be driven at their gates by a bias voltage B14. The drain of NMOS cascode transistor 363 may be coupled to the first differential output $V^+_{out}$, and the drain of NMOS cascode transistor 364 may be coupled to the second differential output $V^-_{out}$. The respective drains of NMOS cascode transistors 363, 364 may be further coupled to the drains of PMOS cascode transistors 323, 324, which may be driven at their gates by a bias voltage B12. The respective sources of PMOS cascode devices 323, 324 may be coupled to the drains of PMOS transistors 313, 314, and the sources of PMOS transistors 313, 314 may be coupled to VDD. First PMOS transistor 313 may have a gate coupled to node 305 and may be driven by the first differential input of the second stage 32. Second PMOS transistor 314 may have a gate coupled to node 306 and may be driven by the second differential input of the second stage 32. For compensation, a resistor 302 and a capacitor 301 may be coupled in series between the first differential input and the first differential output $V^+_{out}$ of the second stage 32, and a resistor 304 and a capacitor 303 may be coupled in series between the second differential input and the second differential output $V^-_{out}$ of the second stage 32.

As shown in FIG. 3, the common-mode feedback circuit 30 may monitor the common-mode voltage of $V^+_{out}$ and $V^-_{out}$. The common-mode sense circuit 50 may sense the common-mode voltage of $V^+_{out}$ and $V^-_{out}$. The positive input to amplifier 40 may be coupled to a voltage reference $V_{ref}$, and the negative input to amplifier 40 may be coupled to the output of the common-mode sense circuit 50. Accordingly, the common-mode voltage of $V^+_{out}$ and $V^-_{out}$ may be measured by amplifier 40 against the reference voltage $V_{ref}$. The amplifier 40 may generate the common-mode feedback signal, $V_{ctrl}$.

As shown in FIG. 3, the common-mode feedback loop may be formed by driving the gates of the first conducting element 351 and the second conducting element 352 with the common-mode feedback signal $V_{ctrl}$. The $V_{ctrl}$ signal may drive the first and second conducting elements 351, 352 in a manner which may keep the common-mode of the differential outputs of the first stage 31 within a desired range regardless of the common mode of the $V^+_{in}$ and $V^-_{in}$ inputs. Accordingly, the differential inputs of the second stage 32 will be driven at a voltage within a desired operating range, and the second stage 32 may drive the differential output, $V^+_{out}$ and $V^-_{out}$, within a desired output range.

The first conducting element 351 may have a first conducting terminal coupled to the first differential output of the first stage 31 at node 305. The second conducting element 352 may have a first conducting terminal coupled to the second differential output of the first stage 31 at node 306. The first conducting element 351 and the second conducting element 352 may be comprised of instantiations of components independent from the instantiations of components forming the first stage 31 and the second stage 32.

The first conducting element 351 may have a second conducting terminal coupled to a low potential power supply GND. The first conducting element 351 may comprise an NMOS transistor. The drain of the NMOS transistor may form the first conducting terminal of the first conducting element 351, and the source of the NMOS transistor may form the second conducting terminal of the first conducting element 351. The second conducting element 352 may have a second conducting terminal coupled to a low potential power supply GND. The second conducting element 352 may comprise an NMOS transistor. The drain of the NMOS transistor may form the first conducting terminal of the second conducting element 352, and the source of the NMOS transistor may form the second conducting terminal of the second conducting element 352. In some alternative embodiments, the first and second conducting elements 351, 352 may comprise one or more devices, including but not limited to PMOS transistors, NMOS transistors, bipolar-junction transistors, JFETs, diodes, resistors, and combinations thereof.

As shown in FIG. 3, the first conducting element 351 may provide a common-mode path 353 into the first differential output of the first stage 31, and the second conducting element 352 may provide a common-mode path 354 into the second differential output of the first stage 31. Common-mode paths 353, 354 may be separate from the differential mode paths 343, 344 in the first stage 31. The common-mode feedback loop does not overlap with the differential mode paths 343, 344 in the first stage 31. Thus, the common-mode feedback loop may operate in a manner that may be not substantially limited by the characteristics of the first stage 31. In particular, the frequency at which the common-mode feedback loop may operate in a stable manner may be unaffected by the sizes of the gate-to-source capacitances of certain transistors in the first stage 31. Accordingly, the NMOS differential pair transistors 341, 342 and the PMOS current sources 311, 312 may have large gate sizes to minimize thermal noise and 1/f noise without impacting the frequency at which the common-mode feedback loop can operate in a stable manner.

Furthermore, the common-mode paths 353, 354 into the first-stage differential outputs may prevent lock-up. When an overly high or overly low common-mode input at $V^+_{in}$ and $V^-_{in}$ causes certain node voltages in the first stage 31 to swing high or low outside of their intended operating range, certain transistors in the first stage 31 may be locked outside of their normal operating range. For example, when an overly low common-mode input at $V^+_{in}$ and $V^-_{in}$ is experienced, the NMOS differential pair transistors 341, 342 may not have the necessary gate-to-source threshold voltage to operate. With the differential pair transistors 341, 342 turned off, the voltage potential of the first and second differential outputs of the first stage 31 may rise. If the outputs of the first stage were allowed to rise to a voltage too high to drive the second stage 32, the $V^+_{out}$ and $V^-_{out}$ outputs of the amplifier 300 could drop and approach the voltage of the low potential power supply GND, and in a configuration where $V^+_{out}$ and $V^-_{out}$ are coupled through a feedback network to $V^+_{in}$ and $V^-_{in}$, the amplifier 300 could lock-up in a stable but undesired state. However, the first conducting element 351 and the second conducting element 352 may provide common-mode current paths 353, 354 into the first-stage outputs that may be independent from transistors in the first stage 31 that may be locked out of their normal operating range. Accordingly, the common-mode feedback loop will not be broken by transistors in the first stage that have turned off in response to an overly high or overly low common-mode input. Thus lock-up due to an overly high or overly low common-mode input into $V^+_{in}$ and $V^-_{in}$ may be prevented.

Some alternative embodiments of the differential amplifier 300 with common-mode feedback as shown in FIG. 3 may include other multi-stage differential amplifier topologies. Some alternative embodiments may include an alternative first-stage topology, an alternative second-stage topology, an alternative common-mode feedback circuit topology, or combinations thereof. Some alternative topologies may include the use other types of transistors, including but not limited to bipolar-junction transistors, JFETs, and combinations thereof with NMOS and PMOS transistors.

The coupling of the second conducting terminals of the conducting elements in various embodiments may depend on the topology chosen for the first stage of an amplifier. For example, as shown by the embodiment illustrated in FIG. 2, to ensure that the outputs of the first stage 21 are driven at a voltage potential sufficient to drive the second stage 22, the common-mode current paths 253, 254 may operate in parallel to the differential current paths 243, 244 inside of the first stage 21. Accordingly, common-mode current paths 253, 254 may provide current from VDD to the differential outputs of the first stage 21 in parallel to the differential current paths 243, 244, which steer current to the differential outputs of the first stage 21 from the PMOS current source 171 coupled to VDD.

But in some embodiments, the common-mode current paths may sink current from the differential outputs in the first stage. For example, as shown by the embodiment illustrated in FIG. 3, to ensure that the outputs of the first stage 31 are driven at a voltage potential sufficient to drive the second stage 32, the common-mode current paths 353, 354 may operate in parallel to the differential current paths 343, 344 inside of the first stage 31. Accordingly, common-mode current paths 353, 354 may sink current from the differential outputs of the first stage 31 to GND in parallel to the differential current paths 343, 344, which may sink current from the differential outputs of the first stage 31 to the NMOS current source 371 coupled to GND.

What is claimed is:

1. A differential amplifier circuit with common-mode feedback comprising:
    a first stage comprising a first differential input configured to drive a first differential pair transistor in a first differential current path, a second differential input configured to drive a second differential pair transistor in a second differential current path, a first differential output, and a second differential output;
    a second stage comprising a first differential input, a second differential input, a first differential output, and a second differential output; and
    a common-mode feedback circuit configured to continuously drive a first conducting element in a conductive state and a second conducting element in a conductive state, the first conducting element in a first common-mode feedback current path parallel to the first differential current path and comprising a first conducting terminal coupled to the first differential output of the first stage, the second conducting element in a second common-mode feedback current path parallel to the second differential current path and comprising a first conducting terminal coupled to the second differential output of the first stage.

2. The amplifier of claim 1, wherein:
    the first conducting element comprises a second conducting terminal coupled to a high potential power supply; and
    the second conducting element comprises a second conducting terminal coupled to a high potential power supply.

3. The amplifier of claim 2, wherein the first conducting element comprises a PMOS transistor and the second conducting element comprises a PMOS transistor.

4. The amplifier of claim 2, wherein the second stage comprises:
    a first NMOS transistor comprising a gate configured to be driven by the first input of the second stage; and
    a second NMOS transistor comprising a gate configured to be driven by the second input of the second stage.

5. The amplifier of claim 1, wherein:
    the first conducting element comprises a second conducting terminal coupled to a low potential power supply; and
    the second conducting element comprises a second conducting terminal coupled to a low potential power supply.

6. The amplifier of claim 5, wherein the first conducting element comprises a first NMOS transistor and the second conducting element comprises a first NMOS transistor.

7. The amplifier of claim 5, wherein the second stage comprises:
    a first PMOS transistor comprising a gate configured to be driven by the first input of the second stage; and
    a second PMOS transistor comprising a gate configured to be driven by the second input of the second stage.

8. A method for providing common-mode feedback in a multi-stage amplifier, comprising:
    generating a common-mode feedback signal based on a reference voltage and a common-mode value of a first differential output and a second differential output of an amplifier; and
    driving continuously a first conducting element in a conductive state and a second conducting element in a conductive state with the common-mode feedback signal, the first conducting element in a first common-mode feedback current path parallel to a first differential current path in a first stage and comprising a first conducting terminal coupled to a first differential output of the first stage, the second conducting element in a second common-mode feedback current path parallel to a second differential current path in the first stage and comprising a first conducting terminal coupled to a second differential output of the first stage.

9. The method of claim 8, wherein:
    the first conducting element comprises a second conducting terminal coupled to a high potential power supply; and
    the second conducting element comprises a second conducting terminal coupled to a high potential power supply.

10. The method of claim 9, wherein the first conducting element comprises a PMOS transistor and the second conducting element comprises a PMOS transistor.

11. The method of claim 8, wherein:
    the first conducting element comprises a second conducting terminal coupled to a low potential power supply; and
    the second conducting element comprises a second conducting terminal coupled to a low potential power supply.

12. The method of claim 11, wherein the first conducting element comprises a first NMOS transistor and the second conducting element comprises a first NMOS transistor.

* * * * *